United States Patent
Simon et al.

(10) Patent No.: US 6,780,678 B2
(45) Date of Patent: Aug. 24, 2004

(54) COOLING OF OPTOELECTRONIC ELEMENTS

(75) Inventors: Jonathan Simon, Castro Valley, CA (US); Ken A. Nishimura, Fremont, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/754,004

(22) Filed: Jan. 8, 2004

(65) Prior Publication Data

US 2004/0142513 A1 Jul. 22, 2004

Related U.S. Application Data

(62) Division of application No. 10/127,290, filed on Apr. 22, 2002, now Pat. No. 6,713,866.

(51) Int. Cl.[7] .............................................. H01L 21/44
(52) U.S. Cl. ...................... 438/122; 257/705; 257/706; 257/712; 257/714; 257/715; 257/717; 438/28; 438/34
(58) Field of Search ................................ 257/705, 706, 257/712, 714, 715, 717; 361/764; 438/28, 34

(56) References Cited

U.S. PATENT DOCUMENTS

| 5,218,515 A | 6/1993 | Bernhardt |
| 5,664,864 A | 9/1997 | Kuth |
| 5,801,442 A | 9/1998 | Hamilton et al. |
| 6,678,168 B2 * | 1/2004 | Kenny et al. ............... 361/764 |

* cited by examiner

Primary Examiner—David Nelms
Assistant Examiner—Mai-Huong Tran

(57) ABSTRACT

Optical systems for cooling optoelectronic elements are provided. A representative optical system includes a substrate and a first optoelectronic element supported by the substrate. Additionally, a first channel is formed in the substrate and a first heat transfer fluid is arranged in the first channel. The first heat transfer fluid is thermally coupled with the first optoelectronic element so that at least a quantity of heat produced by the first optoelectronic element is dissipated by the first heat transfer fluid. Methods and other systems also are provided.

9 Claims, 4 Drawing Sheets

COOLING OF OPTOELECTRONIC ELEMENTS

CROSS REFERENCE TO RELATED APPLICATIONS

This application is a divisional application, which is based on and claims priority to U.S. Utility patent application Ser. No. 10/127,290, filed on Apr. 22, 2002, now U.S. Pat. No. 6,713,866 and which is incorporated herein in its entirety.

FIELD OF THE INVENTION

The present invention generally relates to optoelectronics. In particular, the invention relates to systems and methods that involve cooling of optoelectronic elements.

DESCRIPTION OF THE RELATED ART

Optoelectronics is the branch of electronics that deals with the coupling of electronic and optical devices. As optoelectronic components, e.g., optoelectronic circuits used in communication systems, shrink in size, several problems are encountered. In particular, there is a need to route optical signals over small distances while removing heat quickly from various localized sources.

With respect to the signal routing problem, compact design and tight integration with other components of an optoelectronic component can limit the use of optical signal transmission through free space. Similarly, small component sizes and large numbers of data channels often make the use of optical fibers impractical.

With respect to the heat dissipation problem, traditional packaging techniques typically rely on thermal transport by thermal conduction through a package to an internal heat sink. As is known, such a technique oftentimes is inadequate for dissipating large, localized heat fluxes that can be associated with optoelectronic components.

Based on the foregoing, it should be appreciated that there is a need for improved systems and methods that address these and/or other perceived shortcomings of the prior art.

SUMMARY OF THE INVENTION

The invention involves the use of heat transfer fluid to remove heat from optoelectronic elements. In particular, heat transfer fluid is channeled by a substrate that is used to support optoelectronic elements. The heat transfer fluid is thermally coupled with the optoelectronic elements and cools the optoelectronic elements to reduce a potential for the optoelectronic elements and/or substrate to develop point heat loads.

In accordance with the invention, a recirculation system can be used to move heat transfer fluid through one or more of the channels. For example, an opening of a channel can be connected to a pump for circulating heat transfer fluid through the channel. Additionally, an optional heat exchanger can receive the heat transfer fluid for cooling the heat transfer fluid during circulation.

Various methods for cooling an optoelectronic element supported by a substrate also are provided. In accordance with the invention, a heat transfer fluid is provided. The heat transfer fluid is channeled in the substrate to thermally couple with the optoelectronic element such that at least a quantity of heat produced by the optoelectronic element is dissipated via the heat transfer fluid.

In accordance with the invention, heat transfer fluid can optionally be used to propagate optical signals. For example, optical signals can be propagated to and/or from one or more optoelectronic elements via the heat transfer fluid. For example, a reflector arranged in a channel can direct the optical signal through the heat transfer fluid in the channel.

Clearly, some embodiments of the invention exhibit features and/or advantages in addition to, or in lieu of, those described here. Additionally, other systems, methods, features and/or advantages of the present invention will be or may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings like reference numerals designate corresponding parts throughout the several views.

DETAILED DESCRIPTION

As will be described in detail here, optical systems in accordance with the invention include optoelectronic elements that are cooled by heat transfer fluid. An embodiment of such an optical system is depicted schematically in FIG. 1.

Figure 1:
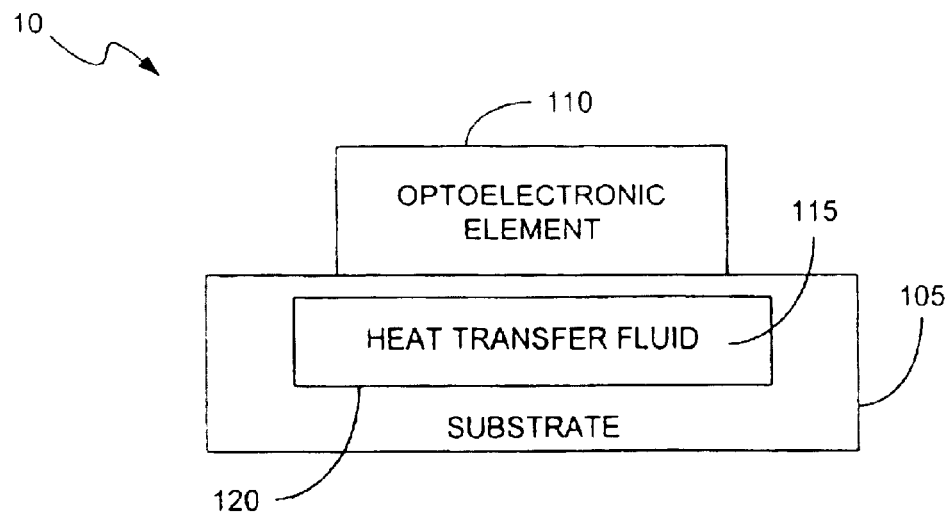
FIG. 1 is a schematic diagram depicting a representative portion of an embodiment of an optical system in accordance with the invention.

As shown in FIG. 1, a representative portion of an embodiment of an optical system 10 in accordance with the invention includes a substrate 105 that supports an optoelectronic element 110. Substrate 105 retains an amount of heat transfer fluid 115 within a channel 120. The channel thermally couples the heat transfer fluid to at least a portion of the optoelectronic element 110.

In operation, when optoelectronic element 110 generates heat, e.g., point heat loads, at least a quantity of the heat generated is transferred to heat transfer fluid 115. The heat transfer fluid dissipates the heat and, thus, reduces the ability of the optoelectronic component to develop point heat loads.

Figure 2:
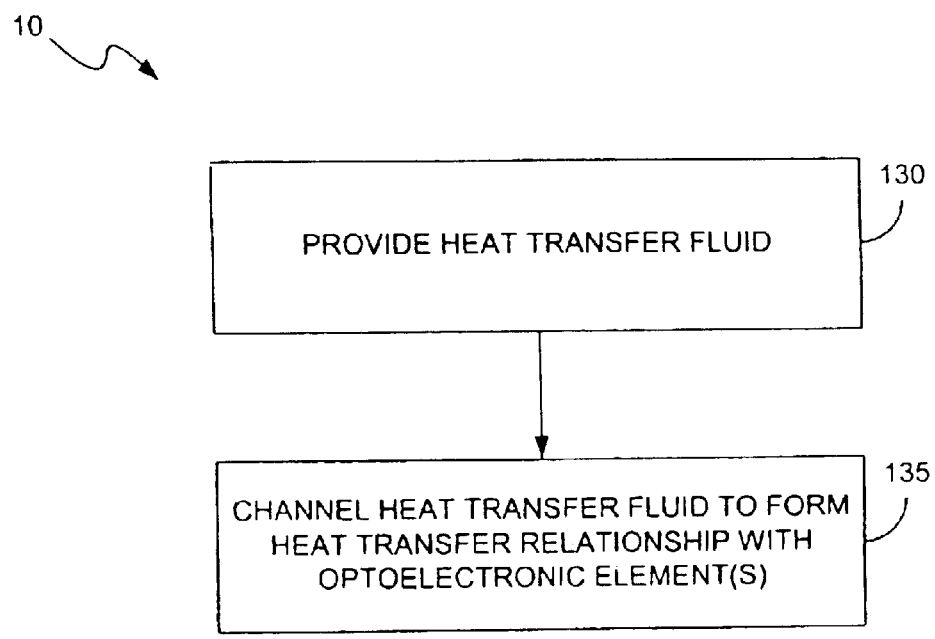
FIG. 2 is a flowchart depicting functionality of the embodiment of the optical system of FIG. 1.

Functionality of the embodiment of the optical system 110 is depicted in the flowchart of FIG. 2. As shown in FIG. 2, the functionality (or method) associated with the optical system may be construed as beginning at block 130, where heat transfer fluid is provided. In block 135, the heat transfer fluid is channeled by the substrate to thermally couple with optoelectronic elements supported by the substrate. This configuration enables heat produced by the optoelectronic elements to be dissipated by the heat transfer fluid.

Various heat transfer fluids can be used. In some embodiments, the heat transfer fluid can be a liquid, e.g., water, while, in other embodiments, the heat transfer fluid can be a gas, e.g., air or nitrogen. In other embodiments, a phase-change medium can be used, i.e.; a medium that changes phase between liquid and gas. Note, in some embodiments, different types of heat transfer fluids can be used. For instance, in one channel of an optical system a liquid can be used, while a gas can be used as the heat transfer fluid in another channel of the system. Clearly, the type of heat transfer fluid would be based on numerous considerations, such as the operating temperature range of the system, the thermal properties of the fluid, and the compatibility of the fluid with the materials that the fluid may contact, for example.

Figure 3:
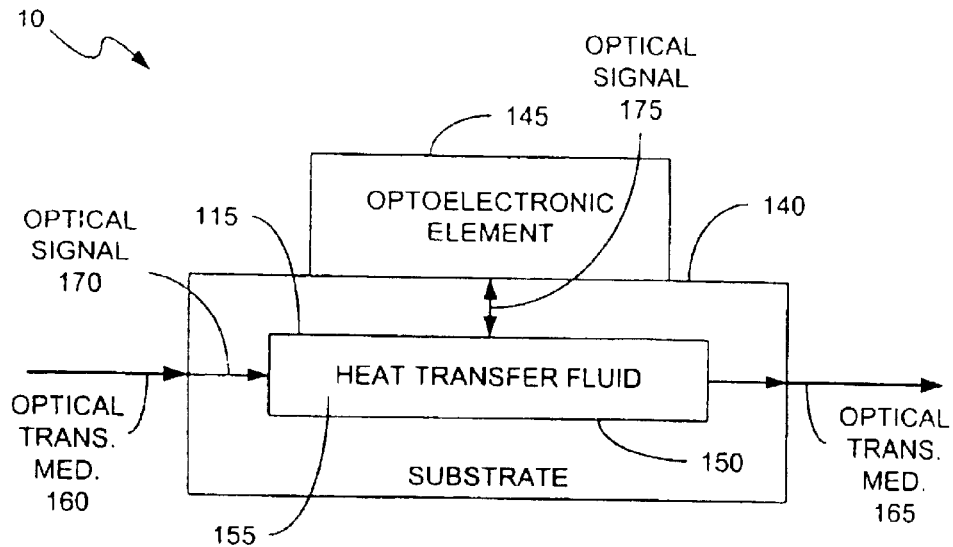
FIG. 3 is a schematic diagram depicting a representative portion of another embodiment of an optical system in accordance with the invention.

Another embodiment of an optical system 10 is depicted schematically in FIG. 3. As shown in FIG. 3, substrate 140 supports an optoelectronic element 145. Substrate 140 also defines a channel 150 that routes heat transfer fluid 155 to thermally couple with the optoelectronic element 145. Heat transfer fluid 155 optically communicates with an input transmission medium 160 and an output transmission medium 165. Thus, heat transfer fluid 155 can receive an optical signal 170 from the input transmission medium 160 and then propagate the optical signal 170 to the output transmission medium 165. The input and output transmission media can include optical components and/or optical fibers, for example.

Also depicted in FIG. 3 is an optical signal 175 that is propagated between the heat transfer fluid 155 and optoelectronic element 145. Thus, the heat transfer fluid 155 can be used to receive optical signals from a transmission medium, propagate optical signals to a transmission medium and/or optically communicate signals to and/or from the optoelectronic element 145.

Figure 4:
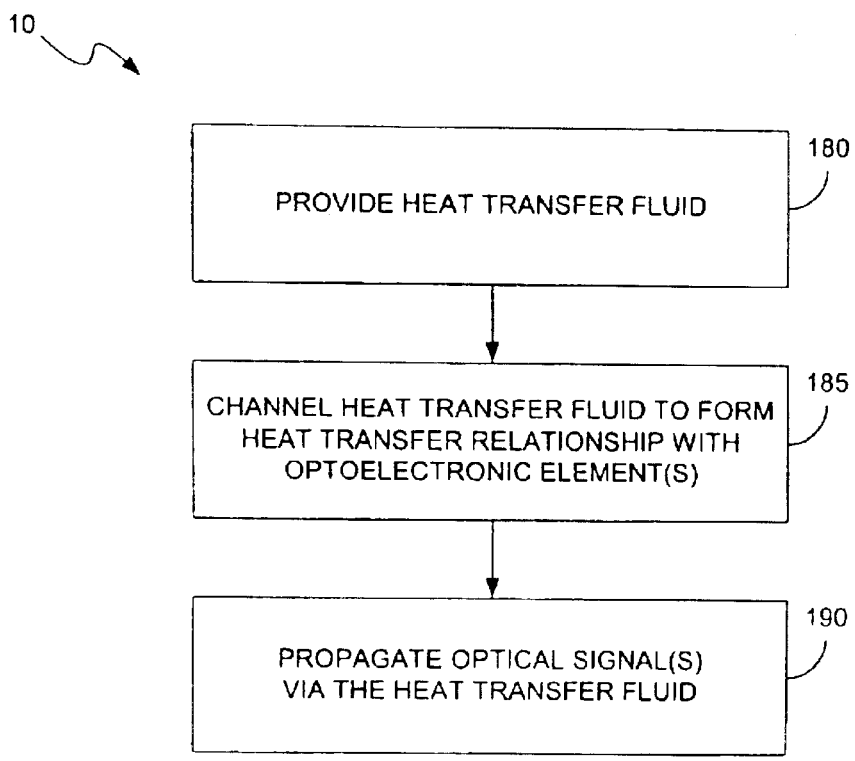
FIG. 4 is a flowchart depicting functionality of the embodiment of the optical system of FIG. 3.

The functionality described above in relation to the embodiment of FIG. 3 is depicted in the flowchart of FIG. 4. In particular, as shown in FIG. 4, the functionality (or method) associated with the optical system maybe construed as beginning at block 180, where a heat transfer fluid is provided. In block 185, the heat transfer fluid is channeled by a substrate to thermally couple with one or more optoelectronic elements supported by the substrate. Thereafter, such as depicted in block 190, one or more optical signals can be propagated via the heat transfer fluid.

Figure 5:
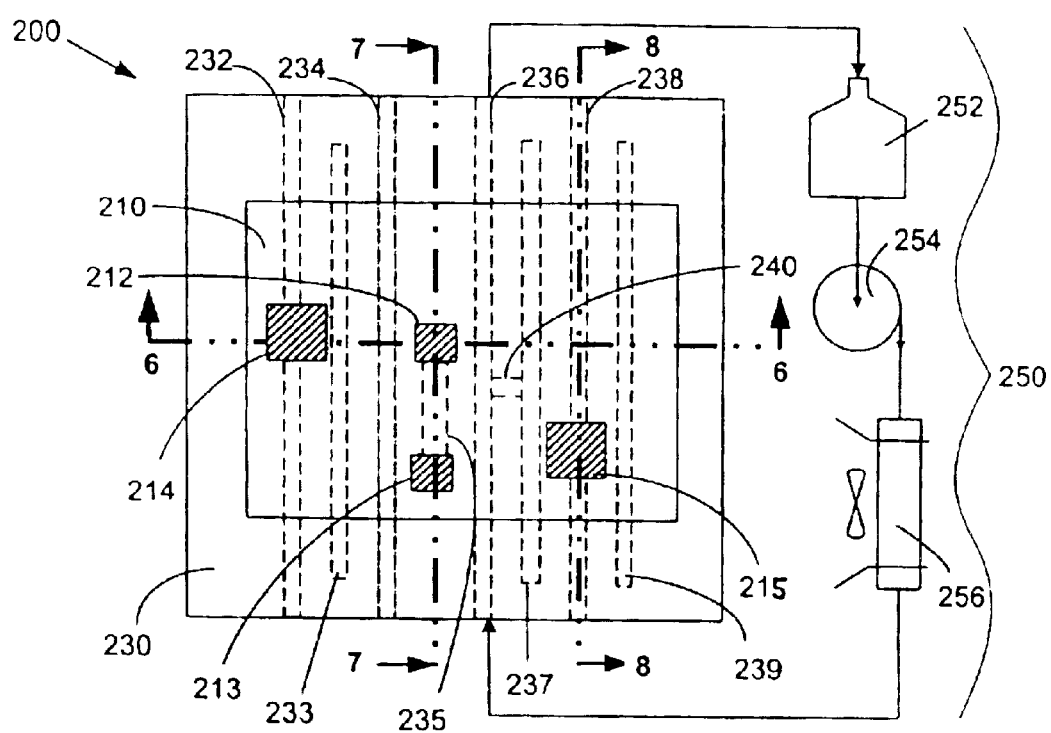
FIG. 5 is a plan view of an embodiment of an optical system in accordance with the invention.
Figure 6:
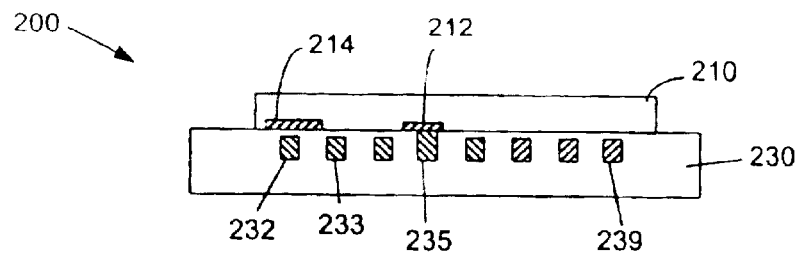
FIG. 6 is a cross-sectional view of the embodiment of FIG. 5 taken along section line VI—VI.
Figure 7:
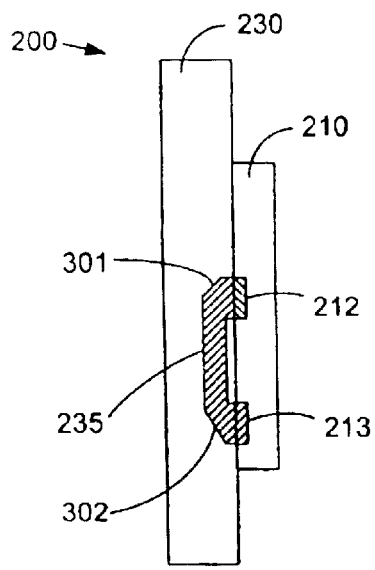
FIG. 7 is a cross-sectional view of the embodiment of FIG. 5 taken along section line VII—VII.
Figure 8:
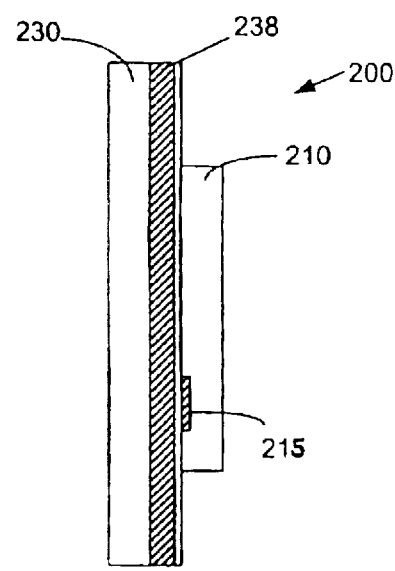
FIG. 8 is a cross-sectional view of the embodiment of FIG. 5 taken along section line VIII—VIII.

Reference will now be made to FIGS. 5–8, which depict another embodiment of an optical system in accordance with the invention. In particular, FIG. 5 is a plan view of an embodiment of an optoelectronic circuit 200. Cross-sections of the optoelectronic circuit 200 corresponding to section-lines VI—VI, VII—VII and VIII—VIII in FIG. 5 are shown in FIGS. 6–8, respectively.

Optoelectronic circuit 200 of FIG. 5 includes an optoelectronic element 210 and substrate 230 for supporting the optoelectronic element 210. Substrate 230 includes at least one planar exterior surface to which the optoelectronic element 210 is attached. By way of example, a flip-chip bonding technique can be used to attach the optoelectronic element to the exterior surface. The optoelectronic element 210 includes several heat-producing devices. For example, a pair of optical devices 212, 213 (such as lasers) and a pair of electronic devices (such as laser drivers) 214, 215 have been depicted in FIG. 5.

Substrate 230 includes numerous channels arranged adjacent to the optoelectronic element 210. In particular, each of the channels is arranged so that heat transfer fluid in a channel thermally couples with at least one of the heat-producing devices 212–215 and/or with the heat transfer fluid of another channel. For example, as illustrated in FIGS. 5 and 6, at least a portion of each of the channels 232, 234, 236, and 238 thermally couples heat transfer fluid to one of the heat-producing devices.

In the embodiment of FIGS. 5–8, the channels 232, 234, and 238 extend along the entire length of the substrate 230 and are open at their respective ends for receiving heat transfer fluid. Channels 233, 235, 237, and 239, however, are closed at their ends. Channels also may be interconnected as illustrated by the connecting channel 240 extending between channels 236 and 237.

As illustrated in FIG. 6, the channels 232–239 are arranged parallel to each other and a short distance below the optoelectronic element 210. Clearly, such a distance is selected to enable thermal coupling of the heat transfer fluid with the optoelectronic element 210 so that the heat transfer fluid removes heat from the optoelectronic element 210. Note, heat removed from an optoelectronic element may be transferred by radiative, conductive and/or convective heat transfer processes. For example, heat from the electronic device 214 can be conducted through a thin layer of the substrate 230 before arriving at channels 232 and/or 233.

Once heat is transferred to the heat transfer fluid, the heat typically diffuses to other parts of the heat transfer fluid. However, this diffusion of heat typically occurs relatively slowly, particularly in liquids which oftentimes exhibit relatively poor thermal conductivity. Forced convection, however, typically is much more effective with respect to heat removal than either conduction or natural convection, which relies on temperature differences between portions of the heat transfer fluid to cause mixing of the fluid as the portions exhibiting higher temperatures rise and the portions exhibiting lower temperatures sink within a channel. The embodiment of FIGS. 5–8 uses forced convection to move the heat transfer fluid within the substrate.

As shown in FIG. 5, each opening in channel 236 is connected to a recirculator 250 for circulating heat transfer fluid through the channels 236, 238, and 240. The recirculator 250 includes an optional reservoir 252 for storing heat transfer fluid that is moved by the pump/compressor 254 through an optional heat exchanger 256. After cooling, cooled heat transfer fluid is directed through channel 236, where a portion of the fluid passes through channel 240 and mixes with the fluid in adjacent channel 237.

After removing heat from the optoelectronic component, the heated fluid is directed back to the pump/compressor 254 for recirculation.

As illustrated in FIG. 7, optical devices 212 and 213 are interconnected by channel 235. Besides cooling the optical devices 212, 213, the heat transfer fluid in channel 235 is capable of propagating an optical signal between these optical devices. In particular, channel 235 includes reflective surfaces or reflectors for directing optical signals through the heat transfer fluid in the channel. In the configuration illustrated in FIG. 6, an optical signal from optical devices 212 propagates through the heat transfer fluid, reflects from reflective surfaces 301 and 302, and propagates toward optical device 213. Note, by propagating optical signals through the heat transfer fluid, the need for additional waveguides, e.g., short optical fibers, extending between the optical devices 212 and 213 may be eliminated.

As mentioned before, various types of heat transfer fluids can be used. In those embodiments that use heat transfer fluid to propagate optical signals, criteria such as the index of refraction of the fluid, and index matching between the fluid and the optoelectronic component(s) also should be considered.

Note, in embodiments in which an optoelectronic element is arranged above the heat transfer fluid, diffusion of heat into heat transfer fluid channeled beneath the heat transfer fluid typically will not initiate natural convection. That is, the heated portion of the heat transfer fluid arranged closest to the optoelectronic element will not tend to sink and create convection currents for more quickly diffusing the heat. This is because that portion of the heat transfer fluid typically is the hottest portion of the fluid and cannot rise farther within the channel. Therefore, it may be desirable in some embodiments to arrange the optoelectronic element below the heat transfer fluid. Thus, as the optoelectronic element heats the lower portion of the heat transfer fluid, that portion of the heat transfer fluid would tend to rise and mix with the lower temperature fluid above.

It should be emphasized that the above-described embodiments of the present invention are merely possible examples of implementations that have been set forth for a clear understanding of the principles of the invention. Many variations and modifications may be made to the above-described embodiment(s) of the invention without departing substantially from the spirit and principles of the invention.

For example, non-planar substrate configurations may be used. Also, although the recirculator has been shown in association with a closed recirculation system, open recirculation systems may be used. All such modifications and variations are intended to be included herein within the scope of this disclosure and the present invention and protected by the following claims.

What is claimed is:

1. A method for operating an optical system, the method comprising:

providing a substrate;

mounting a first optoelectronic element on a surface of the substrate;

forming a first channel in the substrate;

transporting a first heat transfer fluid through the first channel, the first heat transfer fluid being thermally coupled with the first optoelectronic element such-hat at least a quantity of heat produced by the first optoelectronic element is dissipated by the first heat transfer fluid; and using the first channel as an optical waveguide, wherein a portion of the substrate that defines the first channel exhibits a first refractive index, the first heat transfer fluid exhibits a second refractive index, and wherein the first heat transfer fluid operates as a core of the optical waveguide for directing optical signals.

2. The method of claim 1, further comprising:

forming a second channel in the substrate; and transporting a second heat transfer fluid through the second channel, the second heat transfer fluid being thermally coupled with the first optoelectronic element such that at least a quantity of heat produced by the first optoelectronic element is dissipated by the second heat transfer fluid.

3. The method of claim 2, wherein the first heat transfer fluid is different than the second heat transfer fluid.

4. The method of claim 1, wherein the substrate is substantially planar and has an exterior surface; and wherein the first channel is substantially U-shaped, with first and second ends of the first channel terminating at the exterior surface of the substrate.

5. The method of claim 1, wherein the surface of the substrate is a bottom surface of the substrate, and the first heat transfer fluid utilizes convection for heat dissipation.

6. The method of claim 1, wherein the first heat transfer fluid is a liquid.

7. The method of claim 6, further comprising:

providing a recirculator for transporting the first heat transfer fluid through the first channel.

8. The method of claim 6, further comprising:

providing a means for removing heat from the first heat transfer fluid.

9. The method of claim 6, further comprising:

providing a heat exchanger fluidly communicating with the first heat transfer fluid, the heat exchanger being operative to remove heat from the first heat transfer fluid.

* * * * *